United States Patent [19]

Furino, Jr.

[11] Patent Number: 5,581,444
[45] Date of Patent: Dec. 3, 1996

[54] DEVICE AND METHOD FOR ENHANCING THERMAL AND HIGH FREQUENCY PERFORMANCE OF INTEGRATED CIRCUIT PACKAGES

[75] Inventor: James P. Furino, Jr., Melbourne, Fla.

[73] Assignee: Harris Corporation, Melbourne, Fla.

[21] Appl. No.: 507,192

[22] Filed: Jul. 26, 1995

[51] Int. Cl.$^6$ .................................................. H05K 7/20
[52] U.S. Cl. .................... 361/712; 174/52.2; 257/713; 257/796; 361/718
[58] Field of Search ............... 174/16.3, 51, 52.2, 174/52.4; 257/678, 684, 692, 712, 713, 729, 731–733, 787, 796; 361/807–810, 813, 764, 760, 717, 718, 722, 704, 707, 709, 710, 712, 816, 818, 773

[56] References Cited

U.S. PATENT DOCUMENTS

| | | | |
|---|---|---|---|
| 4,809,044 | 2/1989 | Pryor | 357/2 |
| 5,132,896 | 7/1992 | Nishizawa | 363/144 |
| 5,146,310 | 9/1992 | Bayan | 357/70 |
| 5,150,198 | 9/1992 | Ohikata | 357/81 |
| 5,243,217 | 9/1993 | Yamada | 257/692 |
| 5,339,216 | 8/1994 | Lin | 361/707 |
| 5,379,187 | 1/1995 | Lee | 361/707 |
| 5,409,186 | 4/1995 | Chow | 361/707 |

*Primary Examiner*—Gerald P. Tolin
*Attorney, Agent, or Firm*—Rogers & Killeen

[57] ABSTRACT

A method and mount for a high frequency IC that provides a low inductance path for a high frequency current from the IC to the exterior of a package for the IC and the mount. An electrically and thermally conductive metal base for mounting the IC on an upper surface thereof has a lower surface exposed at the exterior of the package that otherwise encloses the base and the IC. The base also has a plurality of solid or hollow columns for increasing a surface area of the mount, thereby decreasing the inductance to a high frequency current in the path between the IC and the lower surface of the base. Each column is electrically connected to a separate ground terminal on the IC. The columns may have narrow necks connecting them to the base to limit common mode inductance between columns, or may be separated from the base to eliminate common mode inductance.

21 Claims, 2 Drawing Sheets

DEVICE AND METHOD FOR ENHANCING THERMAL AND HIGH FREQUENCY PERFORMANCE OF INTEGRATED CIRCUIT PACKAGES

BACKGROUND OF THE INVENTION

The present invention is generally related to packages for integrated circuits, and more specifically to a method and mount for high frequency integrated circuits in which the inductance of the path between the IC and ground is decreased to improve high frequency performance.

Many types of integrated circuits (ICs) are packaged in plastic by suspending the IC in the plastic and extending electrical leads to the IC through the plastic.

High frequency ICs desirably have an electrically conductive path between bonding pads on the IC surface and ground that desirably has low inductance and low electrical resistance. To this end, it is known to mount a bottom of an IC 10 on an electrically conductive metal paddle 12, such as shown in FIG. 1, or on an electrically conductive metal slug 14, such as shown in FIG. 2. Grounding wires 16 connect bonding pads 18 on a top of the IC 10 to the paddle 12 or slug 14. The paddle 12 or slug 14 and its accompanying IC 10 may be suspended in a protective package 20 (e.g., plastic) with a portion of the paddle or slug exposed for contacting ground (the electrical leads for the IC that extend through the package are not shown in FIGS. 1 and 2 in the interest of clarity).

As is known, the skin effect restricts the flow of high frequency current into the metal conductor to only a few microns. Therefore, increasing the surface area of an electrical conductor decreases inductance to high frequency currents. Thus, the electrically conductive path between a high frequency IC and ground desirably is short and has a large surface area.

Further, high power dissipation single-ended ICs need a path between the back of the IC and a heat sink that has a low thermal resistance.

Conventional electrical leads through a package to the IC have too much inductance in the path to ground for high frequency operation and too much thermal resistance for high power operation, and a separate low inductance, low thermal resistance path to ground and to a heat sink is desirably provided.

Accordingly, it is an object of the present invention to provide a novel mount and packaging method for improving the performance of a high frequency IC.

It is another object of the present invention to provide a novel method and mount for an IC in which the mount's surface area is more than that of prior art mounts so that the inductance in the path connecting the IC to ground is decreased.

It is yet another object of the present invention to provide a novel method and mount for an IC in which columns are provided at sides of an IC mount to increase the surface area of the mount, thereby decreasing inductance to high frequency currents in the path between the IC and ground.

It is still another object of the present invention to provide a novel method and mount for a high frequency IC in which an electrically and thermally conductive metal base for mounting the IC includes a plurality of trenches into sides of the base that extend from an upper to a lower surface thereof for increasing a surface area of the mount where each land between adjacent trenches is connected to a separate ground terminal on the IC to provide isolation between lands.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
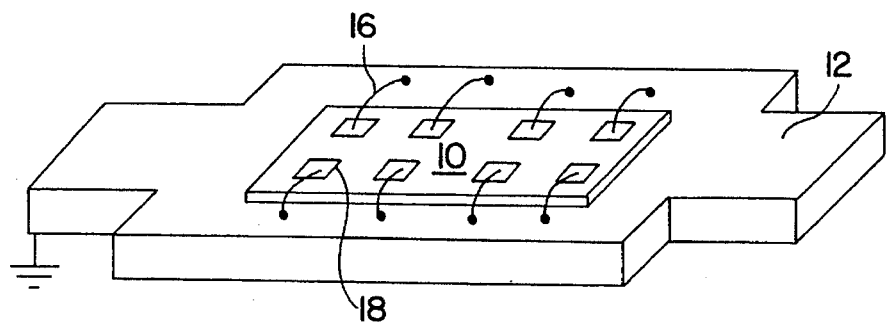
FIG. 1 is a pictorial depiction of an IC mounted on a paddle of the prior art.
Figure 2:
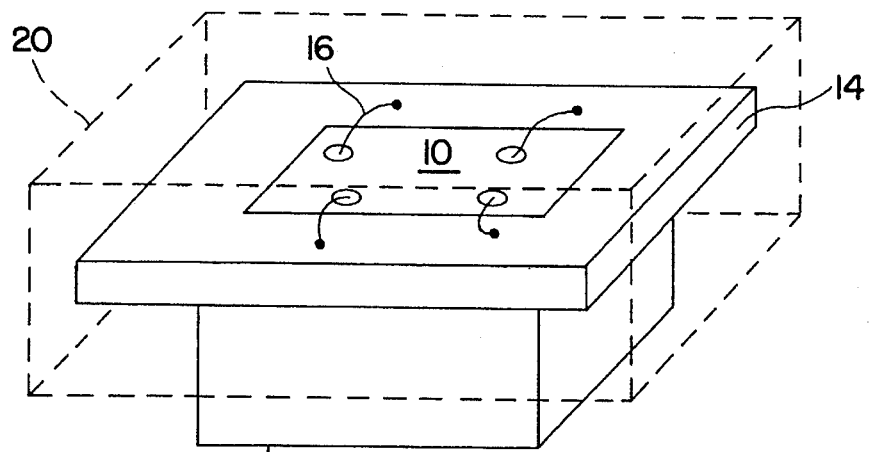
FIG. 2 is a pictorial depiction of an IC mounted on a slug of the prior art.
Figure 3:
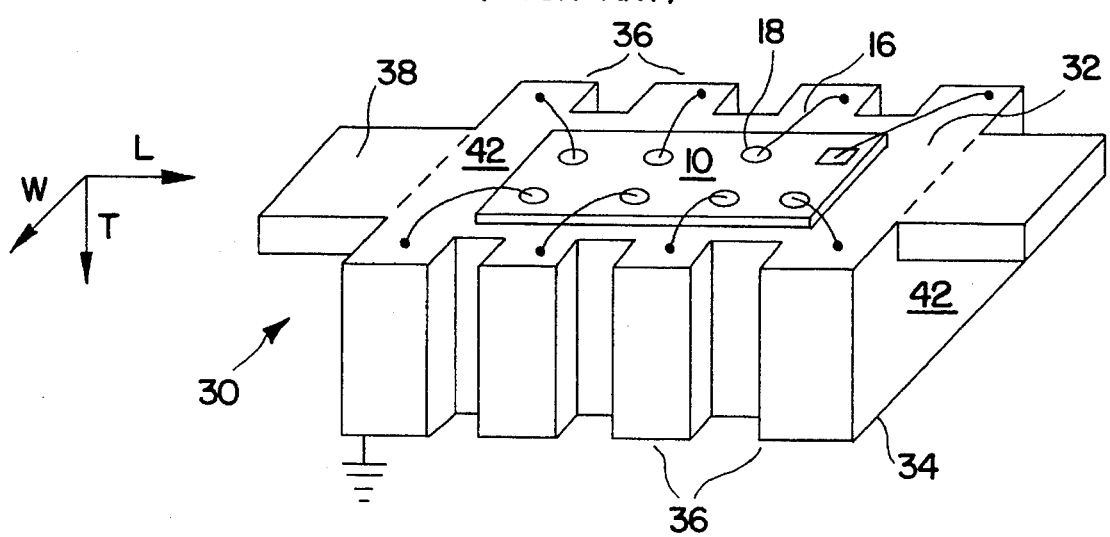
FIG. 3 is a pictorial depiction of an embodiment of the present invention.

With reference now to FIG. 3, an embodiment of the present invention may include a mount 30 for IC 10 that has more surface area than prior art mounts, such as paddle 12 and slug 14 illustrated in FIGS. 1 and 2. Mount 30 may be an electrically and thermally conductive metal with an upper surface 32 for carrying IC 10 and an opposing lower surface 34 that will be exposed for contacting ground when mount 30 and IC 10 are enclosed in a packaging material. Plural columns 36 may be provided on sides of mount 30 to increase the surface area of mount 30, thereby decreasing inductance to high frequency currents in a path from bonding pads 18 on IC 10 to lower surface 34. FIG. 3 shows columns on two sides of the base, although the invention is not so limited.

In a preferred embodiment, there is one column 36 for each ground bonding pad 18 on IC 10. Columns 36 have a large enough upper surface to provide a suitable land area for attachment of grounding wires 16. The thickness of mount 30 is sufficient to allow lower surface 34 to be exposed from the package so that it may be attached to an external ground and/or heat sink. Mount 30 and IC 10 may be encapsulated in a suitable packaging material. Columns 36 may be projections from the side of mount 30 that extend the full thickness of mount 30, or may be substantially as thick so that the lower surface of the columns is generally at the same level as lower surface 34 for contacting the external ground and to facilitate attachment of grounding wires 16.

Mount 30 may include extensions 38 if configured for use as a paddle. Extensions 38 may be omitted (as indicated by the dotted lines) if mount 30 is configured for use as a slug.

Figure 4:
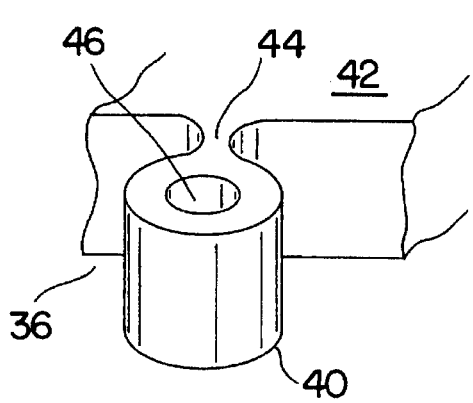
FIG. 4 is a pictorial depiction of a further embodiment of a column of the present invention.
Figure 5:
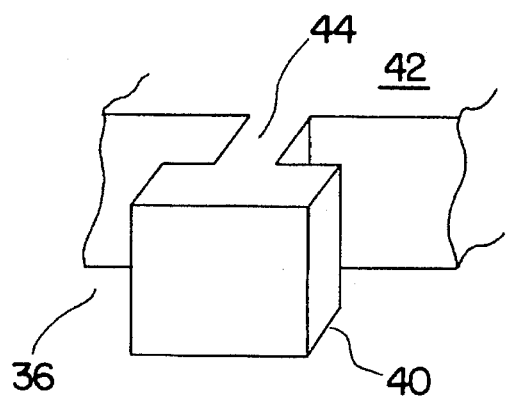
FIG. 5 is a pictorial depiction of yet a further embodiment of a column of the present invention.
Figure 6:
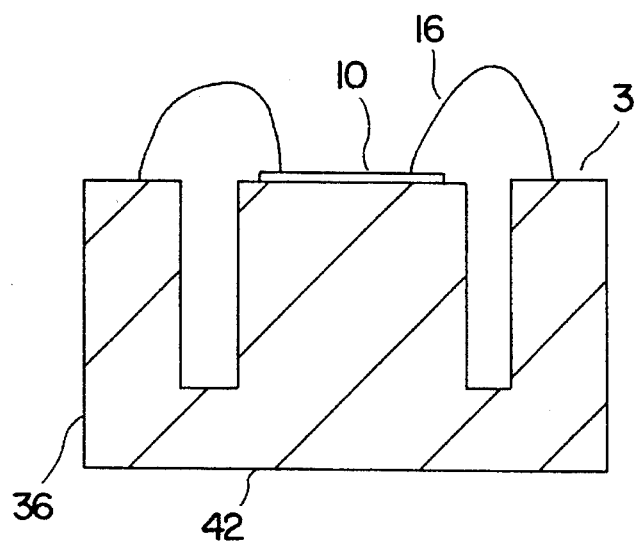
FIG. 6 is a vertical cross section of yet another embodiment of the present invention in which the columns are partially separated from the base.
Figure 7:
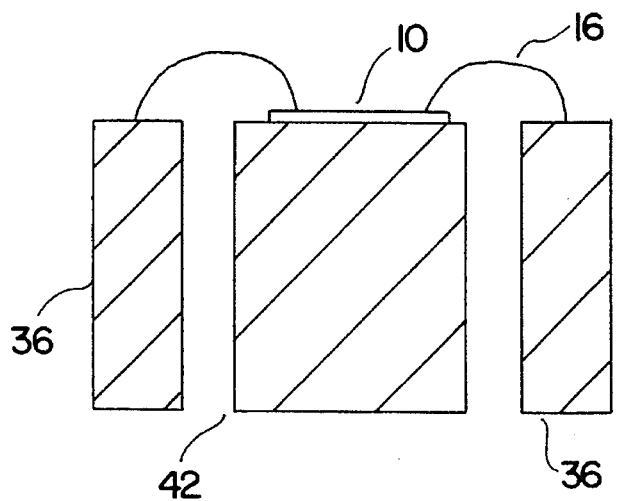
FIG. 7 is a vertical cross section of still another embodiment of the present invention in which the columns are separated from the base.

Common mode inductance in the path between the IC and lower surface 34 may be further reduced by reducing the current flow among columns 36. Reducing current flow among columns reduces the amount of common mode inductance, thereby reducing the interaction among different stages of the IC. To this end, and with reference to FIGS. 4 and 5, columns 36 may include a distal portion 40 attached to a mount base 42 by a neck 44 that is narrower than distal portion 40. Common mode inductance may be further reduced by partially separating columns 36 from base 42, such as illustrated in FIG. 6, or may be eliminated by separating columns 36 from base 42, such as in FIG. 7.

Columns 36 may take any suitable shape, with those shown in FIGS. 3–7 being exemplary. Surface area may be further increased by partially or completely separating columns 36 from base 42 as in FIGS. 4–7, or by providing a cavity in columns 36 so that they are hollow for all of their thickness (e.g., as shown by hollow portion 46 in FIG. 4), or by providing grooves in the columns, or in other ways adaptable to the manufacturing process. Shape may be selected based on ease of manufacturing, on performance, or a compromise of the two.

In the manufacture of mount 30, columns 36 may be formed by trenching the sides of generally parallelepiped base 42 after formation of base 42, by forming base 42 and columns 36 at the same time using conventional metal working techniques, or by adding columns 36 after formation of base 42.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A mount supports an IC within a package and provides a low inductance path for a high frequency current from the IC to an exterior of the package for the IC and said mount, said mount comprising:

an electrically conductive metal base mounting a high frequency IC on an upper surface thereof, said base exposing a lower surface thereof at an exterior of a package that otherwise encloses said base and the IC thereon; and a plurality of trenches extending into sides of said base that extend substantially from said upper surface to said lower surface for increasing a surface area of said mount to thereby form projections between adjacent ones of said trenches, each of said projections having a land at said upper surface for attachment of a different ground terminal of the IC, whereby the increased surface area of said mount decreases inductance of a current path from the IC to the exposed said lower surface.

2. The mount of claim 1 wherein each of said projections comprises a neck that is narrower than a distal portion thereof when viewed from above said upper surface, whereby current flow between said projections is decreased.

3. The mount of claim 1 wherein said base further comprises extensions at lengthwise ends of said base, said extensions having upper surfaces coplanar with said base upper surface and lower surfaces interior to the package.

4. The mount of claim 2 wherein each of said distal portions is generally cylindrical.

5. The mount of claim 2 wherein each of said distal portions is a parallelepiped.

6. The mount of claim 4 wherein said cylindrical distal portions are hollow.

7. The mount of claim 1 wherein said base is a parallelepiped.

8. The mount of claim 7 wherein said projections each comprise a cylindrical distal portion that is connected to a side of said base by a neck region narrower than said cylindrical distal portions then viewed from above said upper surface.

9. The mount of claim 7 wherein said projections each comprise a parallelepiped distal portion.

10. The mount of claim 9 wherein each said parallelepiped distal portion is connected to a of said base by a neck region narrower than said parallelepiped distal portions when viewed from above said upper surface.

11. A package for a high frequency IC that provides a low inductance path for a high frequency current from the IC to an exterior of the package, said package comprising:

a mount comprising an electrically and thermally conductive metal base mounting a high frequency IC on an upper surface thereof, said mount further comprising plural projections of the electrically and thermally conductive metal from sides of said base that extend from said upper surface to a lower surface thereof for increasing a surface area of said mount, wherein each of said plural projections is electrically connected to a different ground terminal on the IC; and protective block enclosing said base the IC thereon and said plural projections while leaving said lower surface exposed sufficiently for attachment to ground and to a heat sink, whereby the increased surface area of said mount decreases inductance of a current path from the IC to ground and said base provides low thermal resistance to heat flowing from the IC to the heat sink.

12. The package of claim 11 wherein each of said plural projections is rectangular when viewed form above said upper surface.

13. The package of claim 11 wherein each of said plural projections is generally circular when viewed from above said upper surface.

14. The package of claim 11 wherein said mount further comprises extensions at lengthwise ends of said base, said extensions having upper surfaces coplanar with said base upper surface and lower surfaces interior to said protective block.

15. The package of claim 11 wherein each of said projections comprise a neck that is narrower than a distal portion thereof so as to form a T-shape when viewed from above said upper surface, whereby current flow between said projections is decreased.

16. The package of claim 11 wherein each of said projections comprise a neck that is narrower than a distal portion thereof and wherein said distal portion is a hollow tube which forms an O-shape when viewed from above said upper surface, whereby current flow between said projections is decreased.

17. A method of decreasing the inductance of a path connecting a high frequency IC to ground, the IC being on an upper surface of a mount that has a portion exposed from a package therefore for contacting ground, the method comprising the steps of:

(a) forming the mount thickness so that a lower surface opposite the upper surface is exposed from the package for contacting ground;

(b) extending trenches into sides of the mount that extend from the upper surface to the lower surface for increasing the surface area of the mount and decreasing the inductance in a path between a terminal on the IC and the lower surface of the mount, the trenches forming projections between adjacent ones of the trenches which have lands at the upper surface, each for attachment of a different ground terminal of the IC; and (c) enclosing the mount, the projections, and the IC in a package, leaving the lower surface exposed for contacting ground.

18. The method of claim 17 further comprising the step of providing the projections with cylindrical distal portions.

19. The method of claim 17 further comprising the step of providing the projections with rectangular distal portions.

20. The method of claim 19 further comprising the step of providing the rectangular distal portions with a narrower neck portion.

21. The method of claim 17 further comprising the step of hollowing out the projections.

* * * * *